United States Patent
Fujii et al.

(10) Patent No.: US 9,257,631 B2
(45) Date of Patent: Feb. 9, 2016

(54) PIEZOELECTRIC VIBRATION ELEMENT, PIEZOELECTRIC VIBRATION DEVICE, AND PORTABLE TERMINAL

(71) Applicant: KYOCERA CORPORATION, Kyoto-shi, Kyoto (JP)

(72) Inventors: Yasuhito Fujii, Kyoto (JP); Satoru Iwasaki, Kyoto (JP); Harumi Hayashi, Kyoto (JP); Kenji Yamakawa, Kyoto (JP)

(73) Assignee: Kyocera Corporation, Kyoto-shi (JP)

( * ) Notice: Subject to any disclaimer, the term of this patent is extended or adjusted under 35 U.S.C. 154(b) by 0 days.

(21) Appl. No.: 14/268,916

(22) Filed: May 2, 2014

(65) Prior Publication Data

US 2014/0232243 A1    Aug. 21, 2014

Related U.S. Application Data

(63) Continuation of application No. 13/995,839, filed as application No. PCT/JP2012/068968 on Jul. 26, 2012.

(51) Int. Cl.
*H01L 41/09*    (2006.01)
*H04M 1/03*    (2006.01)
*B06B 1/06*    (2006.01)

(52) U.S. Cl.
CPC .......... *H01L 41/0926* (2013.01); *B06B 1/0603* (2013.01); *H04M 1/035* (2013.01)

(58) Field of Classification Search
CPC . H01L 41/047; H01L 41/0926; H01L 41/083; H01L 41/39; H03H 9/131; H03H 9/132; H03H 9/0595; H03H 9/19
USPC .......... 310/330, 331, 363, 364, 365, 327, 368
See application file for complete search history.

(56) References Cited

U.S. PATENT DOCUMENTS

| 4,093,883 A | 6/1978 | Yamamoto |
| 5,103,361 A * | 4/1992 | Nagatsuka ............. G11B 5/592 310/332 |

(Continued)

FOREIGN PATENT DOCUMENTS

| JP | 48-056128 A | 8/1973 |
| JP | 61-065599 A | 4/1986 |

(Continued)

OTHER PUBLICATIONS

Japanese Office Action with English concise explanation, Japanese Patent Application No. 2014-002468, Oct. 14, 2014, 6 pgs.

(Continued)

*Primary Examiner* — Shawki S Ismail
*Assistant Examiner* — Bryan Gordon
(74) *Attorney, Agent, or Firm* — Volpe and Koenig, P.C.

(57) ABSTRACT

A piezoelectric vibration element capable of reducing occurrence of unnecessary vibration, and a piezoelectric vibration device and a portable terminal using the same are disclosed. The piezoelectric vibration element includes a plurality of electrode layers and a plurality of piezoelectric layers being stacked along a first direction, the piezoelectric vibration element having two surfaces that face each other to be at intervals in the first direction, and vibrating in bending mode in the first direction with an amplitude varying along a second direction perpendicular to the first direction according to input of an electric signal, one of the two surfaces having such a shape that a central portion thereof in a third direction perpendicular to the first direction and the second direction protrudes as compared with opposite end portions thereof in the third direction.

11 Claims, 9 Drawing Sheets

(56) References Cited

U.S. PATENT DOCUMENTS

| | | | |
|---|---|---|---|
| 7,224,813 B2* | 5/2007 | Hooley | H04R 17/00 381/190 |
| 2003/0095678 A1* | 5/2003 | Hooley et al. | 381/353 |
| 2006/0152112 A1 | 7/2006 | Sasaki | |
| 2006/0158068 A1* | 7/2006 | Shimizu | C04B 35/493 310/358 |
| 2007/0177746 A1 | 8/2007 | Kobayashi et al. | |
| 2008/0122317 A1* | 5/2008 | Fazzio | G01H 11/08 310/328 |
| 2011/0260995 A1* | 10/2011 | Woo | G06F 3/016 345/173 |
| 2012/0026103 A1 | 2/2012 | Woo et al. | |
| 2012/0140969 A1* | 6/2012 | Fujise et al. | 381/333 |

FOREIGN PATENT DOCUMENTS

| | | |
|---|---|---|
| JP | 2005-236352 A | 9/2005 |
| JP | 2007-173456 A | 7/2007 |
| JP | 5225518 B1 | 3/2013 |
| WO | 2005/004535 A1 | 1/2005 |

OTHER PUBLICATIONS

U.S. Office Action mailed Apr. 24, 2015 in U.S. Appl. No. 13/995,839 (parent application).

Extended European Search Report, European Patent Application No. 12870191.9, Oct. 15, 2015, 6 pgs.

* cited by examiner

PIEZOELECTRIC VIBRATION ELEMENT, PIEZOELECTRIC VIBRATION DEVICE, AND PORTABLE TERMINAL

CROSS REFERENCE TO RELATED APPLICATION

This application is a Continuation of U.S. application Ser. No. 13/995,839 filed Jun. 26, 2013, which claims the benefit of PCT Patent Application No. PCT/JP2012/068968, filed Jul. 26, 2012 the entire contents of all of which are incorporated by reference as if fully set forth.

TECHNICAL FIELD

The present invention relates to a piezoelectric vibration element, and a piezoelectric vibration device and a portable terminal using the same.

BACKGROUND ART

In the related art, a piezoelectric vibration device has been proposed in which a piezoelectric bimorph element of a flat plate shape and a vibration plate are disposed at intervals and a central portion of the piezoelectric bimorph element in a length direction thereof is fixed to the vibration plate (for example, refer to Patent Literature 1).

CITATION LIST

Patent Literature

Patent Literature 1: WO2005/004535

SUMMARY OF INVENTION

Technical Problem

However, although the piezoelectric vibration element used in the above-mentioned piezoelectric vibration device in the related art uses thickness-directional vibration with an amplitude that varies in the length direction, for example, mass distribution does not reach complete symmetry due to distortion of an external shape, position shift of an electrode or the like, and thus, unnecessary vibration with an amplitude that varies in the width direction occurs, which may deteriorate a vibration characteristic.

In order to solve the above problem, an object of the invention is to provide a piezoelectric vibration element that is capable of reducing occurrence of unnecessary vibration, and a piezoelectric vibration device and a portable terminal using the same.

Solution to Problem

According to the invention, there is provided a piezoelectric vibration element including a plurality of electrode layers, a plurality of piezoelectric layers, the plurality of electrode layers and the plurality of piezoelectric layers being stacked along a first direction, and two surfaces that face each other so as to be at intervals in the first direction, the piezoelectric vibration element vibrating in bending mode in the first direction with an amplitude that varies along a second direction perpendicular to the first direction according to input of an electric signal, one of the two surfaces having such a shape that a central portion thereof in a third direction perpendicular to the first direction and the second direction protrudes as compared with opposite end portions thereof in the third direction.

According to the invention, there is provided a piezoelectric vibration device including at least the piezoelectric vibration element mentioned above; and a vibration member that is mounted to the other of the two surfaces of the piezoelectric vibration element.

According to the invention, there is provided a portable terminal including at least an electronic circuit; a display; the piezoelectric vibration device mentioned above; and a casing, the vibration member being the display, a part of the display, or a cover of the display, the vibration member being mounted to the casing in a direct way or through a different thing.

Advantageous Effects of Invention

According to the piezoelectric vibration element of the invention, it is possible to obtain a piezoelectric vibration element in which occurrence of unnecessary vibration is reduced. According to the piezoelectric vibration device of the invention, it is possible to obtain a piezoelectric vibration device in which occurrence of unnecessary vibration is reduced. According to the portable terminal of the invention, it is possible to obtain a portable terminal capable of transmitting sound information of high quality.

DESCRIPTION OF EMBODIMENTS

Hereinafter, a piezoelectric vibration element, a piezoelectric vibration device and a portable terminal according to the invention will be described in detail with reference to the accompanying drawings.

First Example of Embodiment

Figure 1:
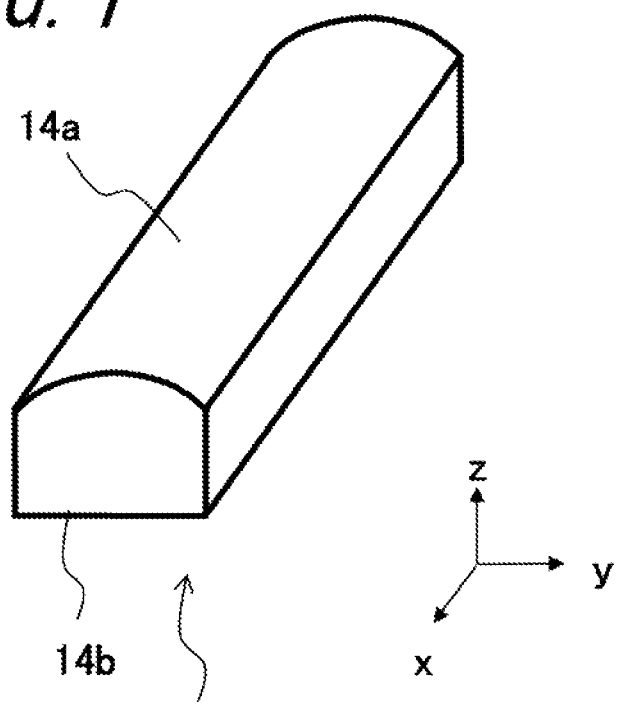
FIG. 1 is a perspective view schematically illustrating a shape of a piezoelectric vibration element according to a first example of an embodiment of the invention.
Figure 2:
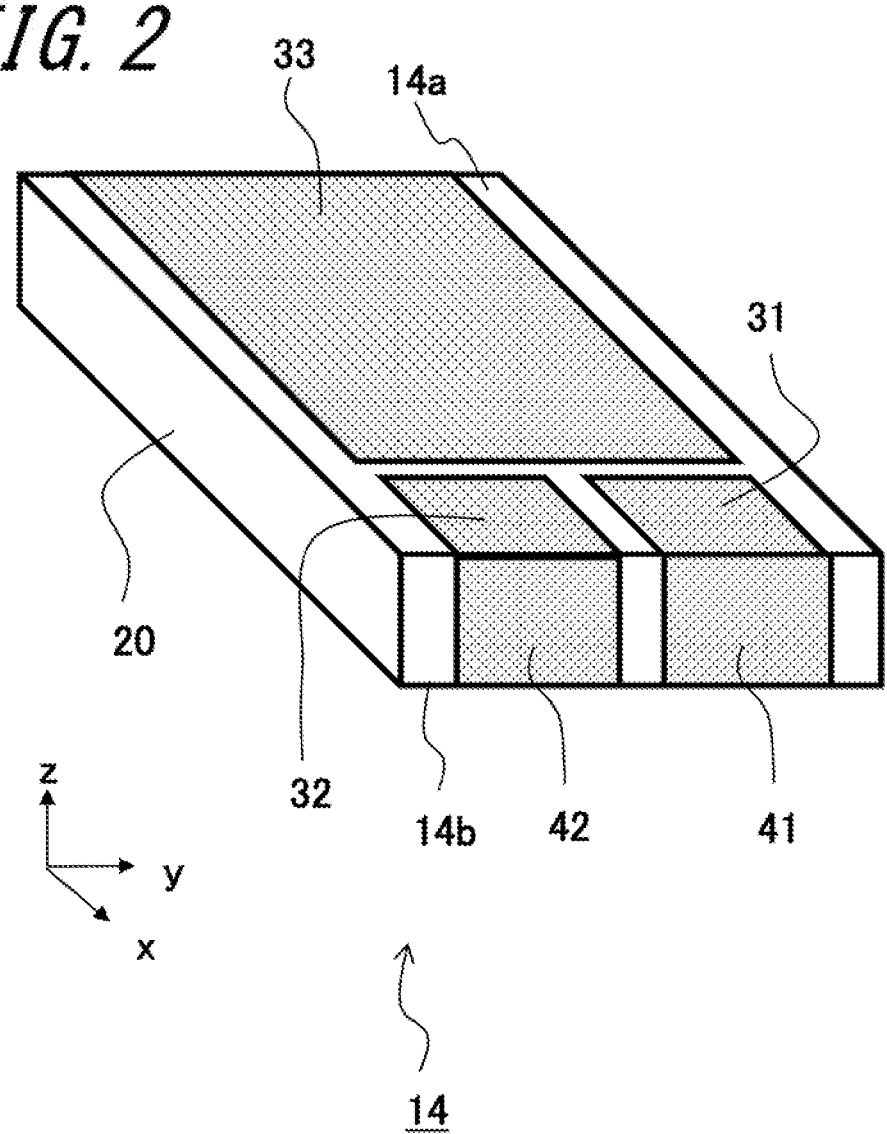
FIG. 2 is a perspective view schematically illustrating a structure of the piezoelectric vibration element shown in FIG. 1.
Figure 4:
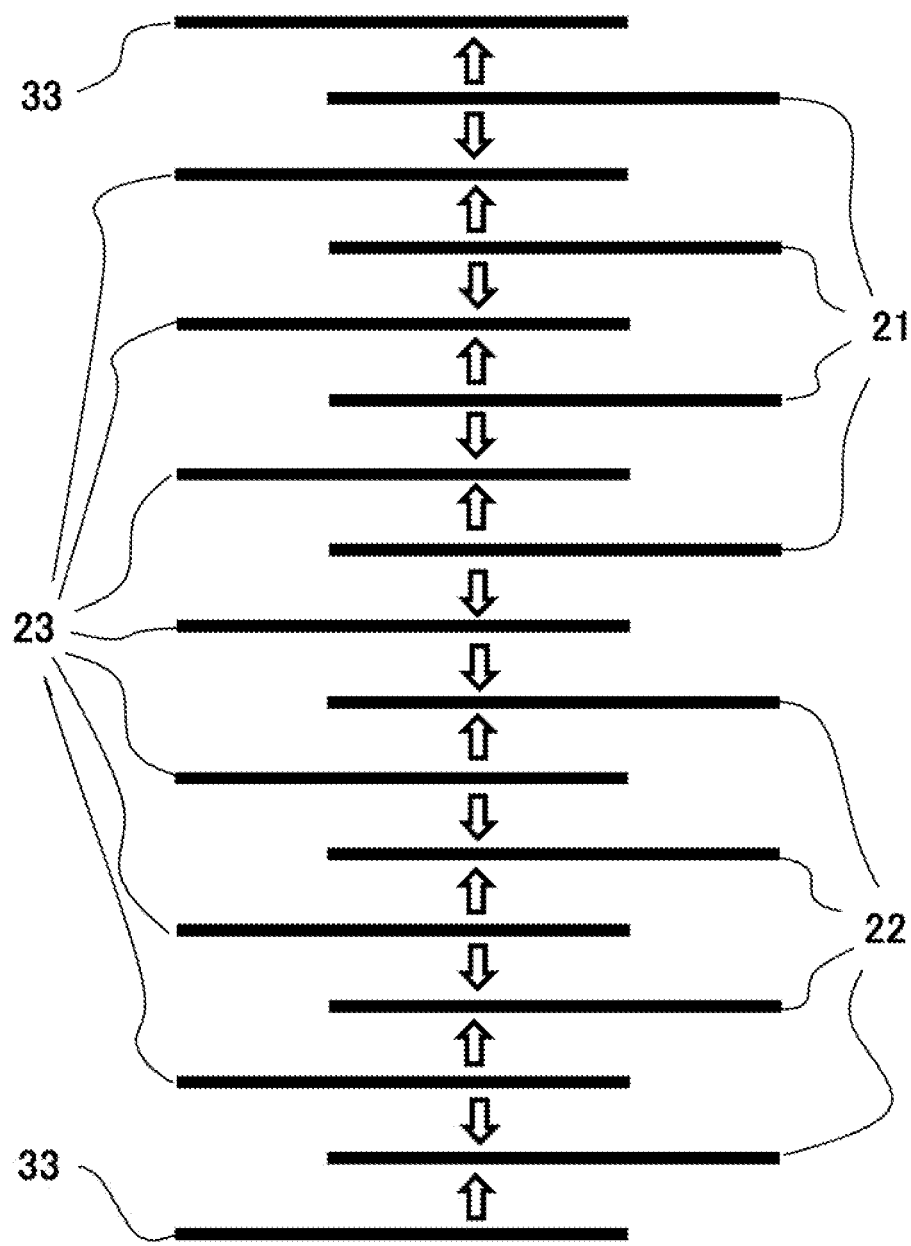
FIG. 4 is a diagram for explaining the structure of the piezoelectric vibration element shown in FIG. 1.
Figure 5:
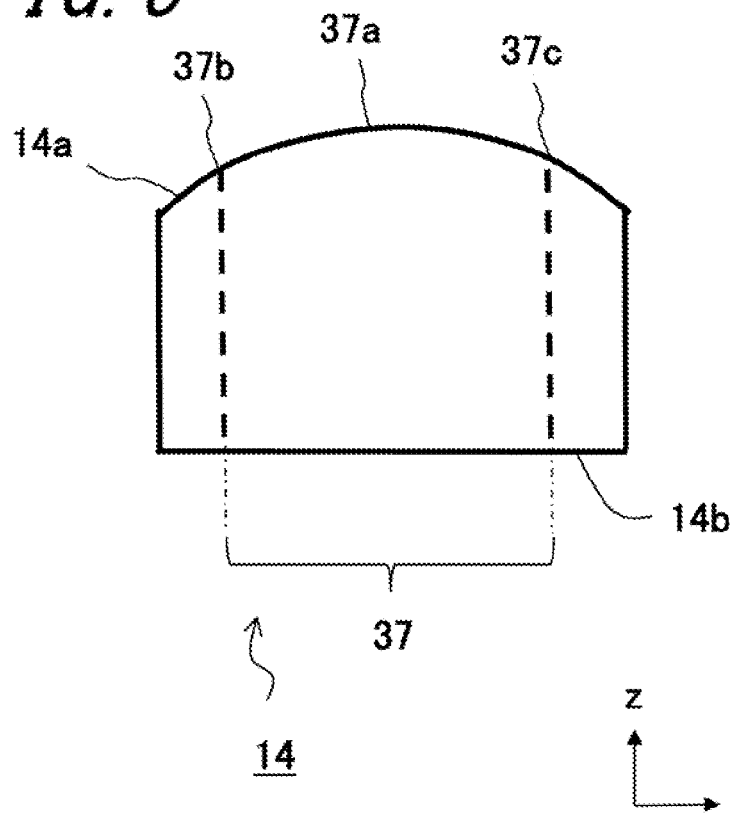
FIG. 5 is a plan view for explaining the shape of the piezoelectric vibration element shown in FIG. 1.
Figure 6:
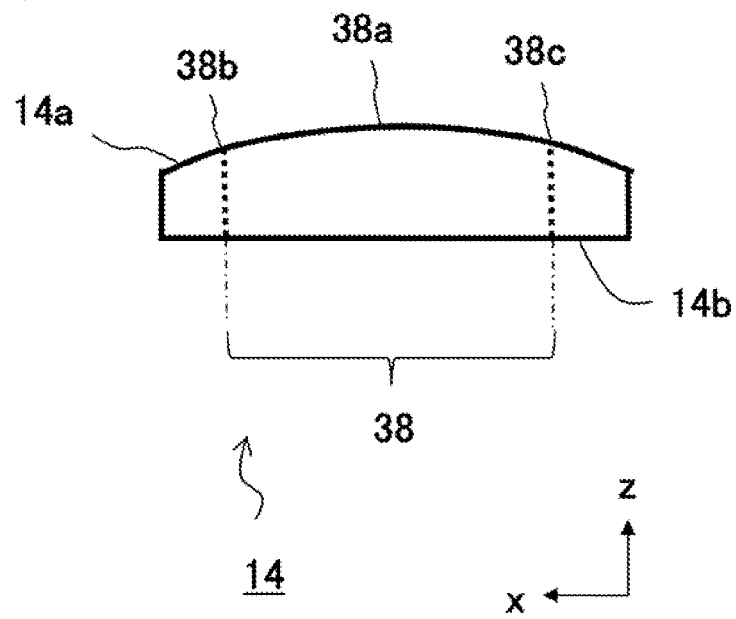
FIG. 6 is a plan view for explaining the shape of the piezoelectric vibration element shown in FIG. 1.

FIG. 1 is a perspective view schematically illustrating a shape of a piezoelectric vibration element according to a first example of an embodiment of the invention. FIG. 2 is a perspective view schematically illustrating a structure of the piezoelectric vibration element shown in FIG. 1. FIGS. 3(a) to 3(d) are plan views for explaining the structure of the piezoelectric vibration element shown in FIG. 1. FIG. 4 is a diagram for explaining the structure of the piezoelectric vibration element shown in FIG. 1. FIG. 5 is a plan view for explaining the shape of the piezoelectric vibration element shown in FIG. 1. FIG. 6 is a plan view for explaining the shape of the piezoelectric vibration element shown in FIG. 1. In FIGS. 1, 5 and 6, a detailed structure of a piezoelectric vibration element 14 is not shown, for ease of drawing. Further, in FIG. 2, the shape of the piezoelectric vibration element 14 is modified into a rectangular parallelepiped, for ease of drawing.

The piezoelectric vibration element 14 of the present example has a shape similar to a rectangular parallelepiped as shown in FIG. 1, and includes a plurality of electrode layers and a plurality of piezoelectric layers, the plurality of electrode layers and the plurality of piezoelectric layers being stacked along a first direction (z axis direction in the figure). Further, the piezoelectric vibration element 14 includes two surfaces (first surface 14a and second surface 14b) that face each other so as to be at intervals in the first direction (z axis direction in the figure). Further, the piezoelectric vibration element 14 vibrates in bending mode in the first direction (z axis direction in the figure) with an amplitude that varies along a second direction (x axis direction in the figure) perpendicular to the first direction (z axis direction in the figure) according to input of an electric signal. That is, the piezoelectric vibration element 14 vibrates in bending mode so that the first surface 14a and the second surface 14b form bending surface according to input of the electric signal.

Further, in the piezoelectric vibration element 14, one (first surface 14a) of the two surfaces that face each other so as to be at intervals in the first direction (z axis in the figure) has such a shape that a central portion thereof in a third direction (y axis direction in the figure) perpendicular to the first direction (z axis in the figure) and the second direction (x axis direction in the figure) protrudes in the first direction (z axis in the figure) as compared with opposite end portions thereof in the third direction. Here, a state where the central portion thereof in the third direction (y axis direction in the figure) protrudes as compared with the opposite end portions thereof in the third direction should not necessarily be maintained over the entire length in the second direction (x axis direction in the figure). Further, on the first surface 14a, the protrusion amount in the +z direction in the figure of the central portion as compared with the opposite end portions in the third direction (y axis direction in the figure) is set to about 7% to 30% of the thickness (dimension in the first direction (z axis direction in the figure)) of the piezoelectric vibration element 14, for example.

Further, in the piezoelectric vibration element 14, the other (second surface 14b) of the two surfaces that face each other so as to be at intervals in the first direction (z axis in the figure) is flat as compared with the first surface 14a. Here, it is preferable that the second surface 14b be as flat as possible. On the second surface 14b, the protrusion amount in the −z direction in the figure of a central portion thereof with respect to opposite end portions thereof in the third direction (y axis direction in the figure) is preferably set to 3% or less of the thickness (dimension in the first direction (z axis direction in the figure)) of the piezoelectric vibration element 14, for example. Further, in the piezoelectric vibration element 14, the dimension in the second direction (x axis direction in the figure) is larger than the dimension in the third direction (y axis direction in the figure). Here, the fact that the second surface 14b is flat as compared with the first surface 14a means that a value of flatness of the second surface 14b is smaller than a value of flatness of the first surface 14a. That is, the protrusion amount of the central portion with respect to the opposite end portions in the third direction (y axis direction in the figure) on the second surface 14b is smaller than the protrusion amount of the central portion with respect to the opposite end portions in the third direction (y axis direction in the figure) on the surface of the first surface 14a. The flatness of the first surface 14a and the second surface 14b may be easily measured using various known flatness measurement apparatuses.

Further, as shown in FIG. 2, the piezoelectric vibration element 14 includes a stacked body 20, surface electrodes 31, 32 and 33, a first connection electrode 41, a second connection electrode 42, and a third connection electrode (not shown). In FIG. 2, the shape of the piezoelectric vibration element 14 is modified into a rectangular parallelepiped, for ease of drawing.

Figure 3:
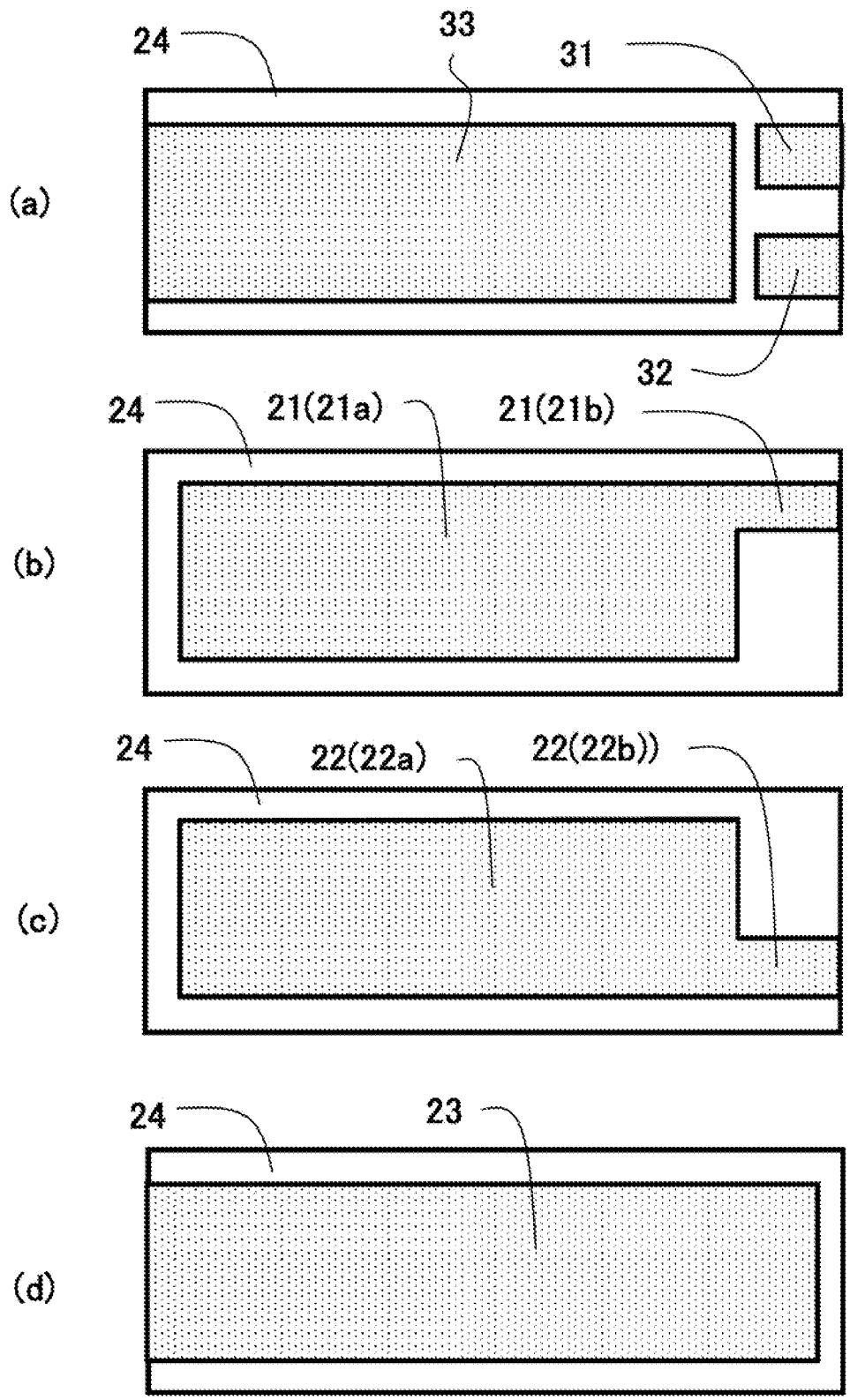
FIGS. 3(a) to 3(d) are plan views for explaining the structure of the piezoelectric vibration element shown in FIG. 1.

As shown in FIG. 3, the stacked body 20 is configured so that a plurality of polarized piezoelectric layers 24 and a plurality of internal electrodes 21, 22 and 23 are stacked in the first direction (z axis direction in the figure) that is the thickness direction of the piezoelectric vibration element 14.

FIGS. 3(a) to 3(d) are plan views schematically illustrating the surface electrodes 31, 32 and 33 and the internal electrodes 21, 22 and 23 included in the piezoelectric vibration element 14. As shown in FIG. 3(a), the surface electrodes 31, 32 and 33 are disposed on each of both main surfaces of the stacked body 20. Further, the internal electrode 21 shown in FIG. 3(b), the internal electrode 22 shown in FIG. 3(c) and the internal electrode 23 shown in FIG. 3(d) are disposed in plural inside the stacked body 20, respectively.

As shown in FIG. 3(b), the internal electrode 21 has a structure in which a rectangular extending portion 21b exposed at one end thereof to a side surface of the stacked body 20 is connected to one end, in the length direction, of a rectangular main portion 21a formed over an approximately overall surface of the piezoelectric layer 24 at intervals with respect to the side surfaces of the stacked body 20. Here, the one end of the extending portion 21b is exposed to the side surface of the stacked body 20 at one end of the stacked body 20 in the length direction.

As shown in FIG. 3(c), the internal electrode 22 has a structure in which a rectangular extending portion 22b exposed at one end thereof to the side surface of the stacked body 20 is connected to one end, in the length direction, of a rectangular main portion 22a formed over an approximately overall surface of the piezoelectric layer 24 at intervals with respect to the side surfaces of the stacked body 20. Here, the one end of the extending portion 22b is exposed to the side surface of the stacked body 20 at the one end of the stacked body 20 in the length direction.

As shown in FIG. 3(d), the internal electrode 23 has a rectangular shape formed over an approximately overall surface of the piezoelectric layer 24. Further, the internal electrode 23 is exposed at only one end thereof to a side surface of the stacked body 20 in the length direction, and is formed at the other end thereof at intervals with respect to the side surfaces of the stacked body 20. Here, the one end of the internal electrode 23 is exposed to the side surface of the stacked body 20 at the other end of the stacked body 20 in the length direction. The extending portion 21b and the extending portion 22b are disposed at intervals in the width direction of the stacked body 20 so as not to overlap with each other in the thickness direction (stacking direction) of the stacked body 20.

As shown in FIG. 3(a), the surface electrode 33 has a rectangular shape. Further, the surface electrode 33 is exposed at only one end thereof in the length direction to the side surface of the stacked body 20, and is formed at the other ends thereof at intervals with respect to the side surfaces of the stacked body 20. The surface electrode 33 is formed over a region of 80% or more of the stacked body 20 in the length direction. Further, the one end of the surface electrode 33 is exposed to the side surface of the stacked body 20 at the other end of the stacked body 20 in the length direction.

As shown in FIG. 3(a), between one end of the stacked body 20 in the length direction and the other end of the surface electrode 33 in the length direction, the surface electrode 31 and the surface electrode 32 are disposed at an interval in the width direction of the stacked body 20. The surface electrode 31 and the surface electrode 32 have a rectangular shape, and are exposed at one end thereof in the length direction to the side surface of the stacked body 20 at the one end of the stacked body 20 in the length direction. Further, the surface electrode 31 and the surface electrode 32 are disposed at an interval between the other end thereof in the length direction and the surface electrode 33, and at intervals with respect to side surfaces of the stacked body 20 in the width direction of the stacked body 20.

Further, in the stacked body 20, the internal electrodes 21, 22 and 23 and the piezoelectric layers 24 are alternately disposed in the first direction (z axis direction in the figure) that is the stacking direction. FIG. 4 is a diagram schematically illustrating arrangement of the surface electrode 33 and the internal electrodes 21, 22 and 23 in the stacking direction of the stacked body 20, and a polarizing direction in the piezoelectric layers 24 disposed between the surface electrode 33 and the internal electrodes 21, 22 and 23. As shown in FIG. 4, the internal electrode 21 or the internal electrode 22 and the surface electrode 33 or the internal electrode 23 are alternately disposed in the first direction (z axis direction in the figure). Further, the internal electrode 21 and the internal electrode 23 or the surface electrode 33 are alternately disposed on one side (+z directional side in the figure) in the stacking direction of the stacked body 20, and the internal electrode 22 and the internal electrode 23 or the surface electrode 33 are alternately disposed on the other side (−z directional side in the figure) in the stacking direction of the stacked body 20. That is, the piezoelectric vibration element 14 includes the plurality of electrode layers (flat electrodes) having the surface electrodes 33 and the internal electrodes 21, 22 and 23, and the plurality of piezoelectric layers 24, which are alternately stacked along the first direction (z axis direction in the figure).

In the plurality of internal electrodes 21, the end portions of the extending portions 21b exposed to the side surface of the stacked body 20 are connected to each other by the first connection electrode 41, at one end portion (+x directional end portion) of the stacked body 20 in the second direction (x axis direction in the figure) that is the length direction. Further, the plurality of internal electrodes 21 are connected to the surface electrodes 31 respectively disposed on the both main surfaces of the stacked body 20 through the first connection electrode 41.

Further, in the plurality of internal electrodes 22, the end portions of the extending portions 22b exposed to the side surface of the stacked body 20 are connected to each other by the second connection electrode 42, at one end portion (+x directional end portion) in the second direction (x axis direction in the figure). Further, the plurality of internal electrodes 22 are connected to the surface electrodes 32 respectively disposed on the both main surfaces of the stacked body 20 through the second connection electrode 42.

Further, in the plurality of internal electrodes 23, the end portions thereof exposed to the side surface of the stacked body 20 are connected to each other by the third connection electrode (not shown), at the other end portion (−x directional end portion in the figure) in the second direction (x axis direction in the figure). Further, the plurality of internal electrodes 23 are connected to the surface electrodes 33 respectively disposed on the both main surfaces of the stacked body 20 through the third connection electrode (not shown). According to this configuration, the surface electrodes 31, 32 and 33 function as terminal electrodes in the piezoelectric vibration element 14. As all of the surface electrodes 31, 32 and 33 are respectively disposed on the both main surfaces of the stacked body 20, it is possible to perform voltage application in polarization of the piezoelectric layer 24 and voltage application in vibration of the piezoelectric vibration element 14 on any one main surface of the piezoelectric vibration element 14 (stacked body 20).

Further, the piezoelectric layers 24 disposed between the internal electrodes 21, 22 and 23 are polarized in directions indicated by arrows in FIG. 4. For example, a DC voltage may be applied to the surface electrodes 31, 32 and 33 so that an electric potential of the surface electrode 31 is high and an electric potential of the surface electrode 32 is low with respect to the surface electrode 33, to achieve such a polarization. Further, when the piezoelectric vibration element 14 vibrates, an AC voltage is applied to the surface electrodes 31, 32 and 33 so that the surface electrode 31 and the surface electrode 32 have the same electric potential and an electric potential difference is generated between the surface electrodes 31 and 32 and the surface electrode 33. According to this configuration, in the piezoelectric vibration element 14, a polarization direction according to a direction of an electric field applied at a certain instant is reversed to occupy a half on one side and a half on the other side in the thickness direction of the piezoelectric vibration element 14 (z axis direction in the figure).

That is, for example, when a half on one side of the piezoelectric vibration element 14 in the thickness direction (z axis direction in the figure) is extended in the length direction of the piezoelectric vibration element 14 (x axis direction in the figure) at a certain instant by application of an electric signal, a half on the other side of the piezoelectric vibration element 14 in the thickness direction is contracted in the length direction of the piezoelectric vibration element 14. Accordingly, the piezoelectric vibration element 14 by itself vibrates in bending mode by application of an electric signal. That is, the piezoelectric vibration element 14 vibrates in bending mode in the first direction (z axis direction in the figure) with an amplitude that varies in the second direction (x axis direction in the figure), by application of an electric signal. In this way, the piezoelectric vibration element 14 is configured by a piezoelectric body having a bimorph structure (piezoelectric bimorph element).

In the piezoelectric vibration element 14 of the present example, since one surface (first surface 14a) in the first direction (z axis direction in the figure) has such a shape that the central portion thereof in the third direction (y axis direction in the figure) protrudes in the first direction (+z axis direction in the figure) as compared with the opposite end portions thereof in the third direction, it is possible to reduce occurrence of unnecessary vibration.

That is, in the piezoelectric vibration element having the flat plate shape of the rectangular parallelepiped in the related art, mass distribution does not reach complete symmetry due to distortion of an external shape, position shift of an electrode or the like, and thus, unnecessary vibration with an amplitude that varies in the width direction slightly occurs, which may deteriorate a vibration characteristic. On the other hand, in the piezoelectric vibration element 14 of the present example, it is possible to reduce occurrence of unnecessary vibration with an amplitude that varies in the width direction. Although a mechanism that causes this effect has not been clarified yet, it is considered that mass concentration in the central portion in the width direction or difficulty of deformation in the width direction may be associated with this effect.

Further, in the piezoelectric vibration element 14 of the present example, since the other one (second surface 14b) of two surfaces that face each other so as to be at intervals in the first direction (z axis direction in the figure) is flat as compared with the first surface 14a, it is possible to rigidly bond the second surface 14b to a target to which vibration is applied. That is, in a case where the piezoelectric vibration element 14 is bonded to a target (vibration plate or the like) to which vibration is applied, stress is concentrated on a bonding surface between the target to which vibration is applied and the piezoelectric vibration element 14, and it is thus necessary to rigidly bond the target to which vibration is applied and the piezoelectric vibration element 14. In the piezoelectric vibration element 14 of the present example, since the second surface 14b is flat, it is possible to rigidly bond the entire second surface 14b to the target to which vibration is applied with ease.

Further, in the piezoelectric vibration element 14 of the present example, since the dimension in the second direction (x axis direction in the figure) is larger than the dimension in the third direction (y axis direction in the figure), it is possible to strongly generate vibration in the first direction (z axis direction in the figure) with an amplitude that varies in the second direction (x axis direction in the figure), and to further reduce occurrence of unnecessary vibration with an amplitude that varies in the third direction (y axis direction in the figure).

Further, in the piezoelectric vibration element 14 of the present example, as shown in FIG. 5, the first surface 14a is configured so that a central portion 37a, in the third direction (y axis direction in the figure), of a region 37 in which the electrode layers having the surface electrode 33 and the internal electrodes 21, 22 and 23 are disposed (region 37 in which deformation occurs according to input of an electric signal) protrudes to the +z side as compared with opposite end portions (37b and 37c) in the second direction. Accordingly, it is possible to enhance the effect of reducing occurrence of unnecessary vibration.

Further, in the piezoelectric vibration element 14 of the present example, as shown in FIG. 6, the first surface 14a is configured so that a central portion thereof in the second direction (x axis direction in the figure) protrudes on the +z side as compared with opposite end portions thereof in the second direction. Accordingly, when a vibration plate is bonded to the second surface 14b to form a vibration device, it is possible to enhance symmetry of vibration in the first direction (z axis direction in the figure).

Further, in the piezoelectric vibration element 14 of the present example, as shown in FIG. 6, the first surface 14a is configured so that a central portion 38a, in the second direction (x axis direction in the figure), of a region 38 in which the electrode layers having the surface electrode 33 and the internal electrodes 21, 22 and 23 and the piezoelectric layer 24 are alternately stacked (region 38 in which deformation occurs according to input of an electric signal) protrudes on the +z side as compared with opposite end portions (38b and 38c) in the second direction. Accordingly, when a vibration plate is bonded to the second surface 14b to form a vibration device, it is possible to enhance symmetry of vibration in the first direction (z axis direction in the figure).

In the piezoelectric vibration element 14 of the present example, the length of the stacked body 20 is preferably about 18 mm to 28 mm, and more preferably about 22 mm to 25 mm, for example. The width of the stacked body 20 is preferably about 1 mm to 6 mm, and more preferably about 3 mm to 4 mm, for example. The thickness of the stacked body 20 is preferably about 0.2 mm to 1.0 mm, and more preferably about 0.4 mm to 0.8 mm, for example. Further, the lengths of the main portion 21a of the internal electrode 21 and the main portion 22a of the internal electrode 22 are preferably about 17 mm to 25 mm, and more preferably about 21 mm to 24 mm, for example. The length of the internal electrode 23 is preferably about 19 mm to 27 mm, and more preferably about 22 mm to 24 mm, for example. The length of the surface electrode 33 is preferably about 17 mm to 23 mm, and more preferably about 19 mm to 21 mm, for example. The widths of the main portion 21a of the internal electrode 21, the main portion 22a of the internal electrode 22, the internal electrode 23 and the surface electrode 31 are preferably about 1 mm to 5 mm, and more preferably about 2 mm to 4 mm, for example. The lengths of the surface electrode 31 and the surface electrode 32 are preferably about 1 mm to 3 mm. The widths of the surface electrode 31 and the surface electrode 32 are preferably about 0.5 mm to 1.5 mm. Using the stacked body 20 having such a shape, it is possible to achieve the piezoelectric vibration element 14 of a small size that is capable of generating strong vibration.

The piezoelectric layer 24 that forms the stacked body 20 may be formed by favorably using lead zirconate (PZ), lead zirconate titanate (PZT), a non-lead based piezoelectric material such as a Bi layered compound or a tungsten bronze structure compound, for example, but other piezoelectric materials may be used. The thickness of one layer of the piezoelectric layer 24 is preferably set to about 0.01 mm to 0.1 mm in consideration of low voltage driving. Further, in order to obtain large bending vibration, it is preferable to have a piezoelectric constant d31 of 200 pm/V or higher. The internal electrodes 21, 22 and 23 that form the piezoelectric vibration element 14 may be formed by favorably using a material containing a ceramic component or a glass component in addition to a metallic component such as silver or alloy of silver and palladium, for example, but may be formed by using other known metallic materials. The piezoelectric vibration element 14 having such a configuration may be manufactured by the following method, for example. First, a binder, a dispersing agent, a plasticizer and a solvent are added to powder of a piezoelectric material, and the mixture is stirred to prepare slurry. Then, the obtained slurry is molded in a sheet form to prepare a green sheet. Then, conductive paste is printed on the green sheet to form an electrode pattern that corresponds to the internal electrodes 21, 22 and 23. Then, the green sheets in which the electrode pattern is formed are stacked and pressed using a press apparatus so that pressure is applied at least in the stacking direction to prepare a stacked compact. Thereafter, degreasing and firing are performed, and the result is cut into a predetermined size, to thereby obtain a stacked body. Then, conductive paste for forming the surface electrodes 31, 32 and 33, the first connection electrode 41, the second connection electrode 42 and the third connection electrode (not shown) is printed, and the result is burned at a predetermined temperature. Then, a DC voltage is applied through the surface electrodes 31, 32 and 33 to perform polarization of the piezoelectric layer 24. In this way, it is possible to obtain the piezoelectric vibration element 14. In such a manufacturing process, for example, by using a mold that includes a plurality of concaves as an upper mold (on a contact side with the first surface 14a) of the press apparatus, and by using a flat mold as a lower mold (on a contact side with the second surface 14b) of the press apparatus, it is possible to manufacture the piezoelectric vibration element 14 of the above-mentioned shape.

Second Example of Embodiment

Figure 7:
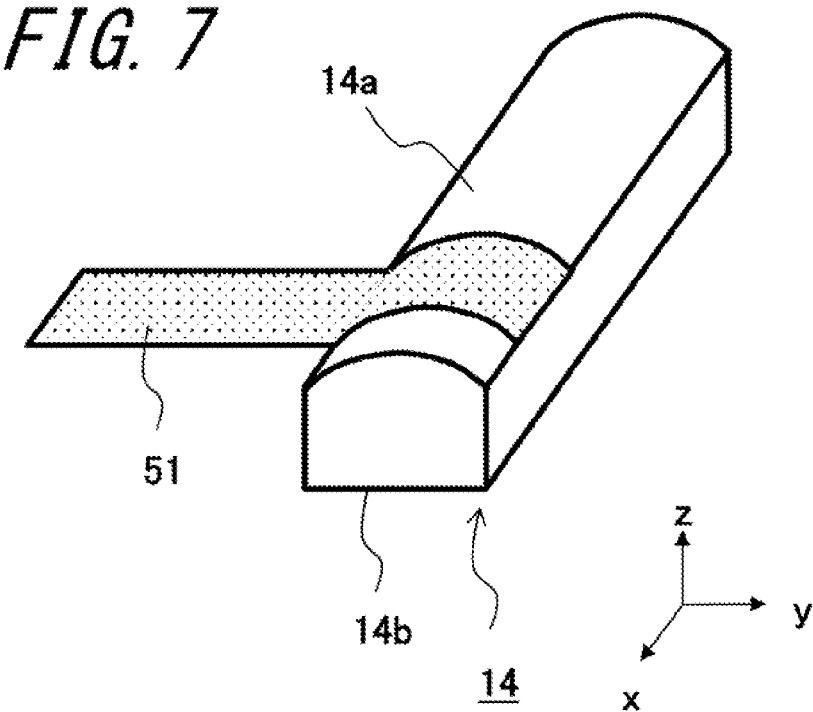
FIG. 7 is a perspective view schematically illustrating a piezoelectric vibration element according to a second example of the embodiment of the invention.

FIG. 7 is a perspective view schematically illustrating a piezoelectric vibration element according to a second example of the embodiment of the invention. In FIG. 7, for ease of drawing, a detailed structure of the piezoelectric vibration element 14 is not shown. Further, in the piezoelectric vibration element of the present example, different points from the piezoelectric vibration element according to the above-described first example of the embodiment will be described.

The piezoelectric vibration element of the present example includes the piezoelectric vibration element 14 according to the above-described first example of the embodiment and a connection wiring 51. The connection wiring 51 is a flexible printed wiring board in which two conductive lines (not shown) are embedded in a film, and a connector (not shown) for connection with an external circuit is connected to one end thereof. The other end of the connection wiring 51 is connected to the surface electrode 31, the surface electrode 32 and the surface electrode 33 on the first surface 14a of the piezoelectric vibration element 14. Specifically, one of the two conductive lines is connected to the surface electrode 31, and the other of the two conductive lines is connected to both of the surface electrode 32 and the surface electrode 33.

According to the piezoelectric vibration element of the present example having such a configuration, since the connection wiring 51 is mounted to the first surface 14a having such a shape that the central portion thereof in the third direction (y axis direction in the figure) protrudes as compared with the opposite end portions thereof in the third direction, it is possible to bond the overall surface of the flat second surface 14b to a target to which vibration is applied. Accordingly, it is possible to obtain a piezoelectric vibration element capable of being rigidly bonded to the target to which vibration is applied.

Third Example of Embodiment

Figure 8:
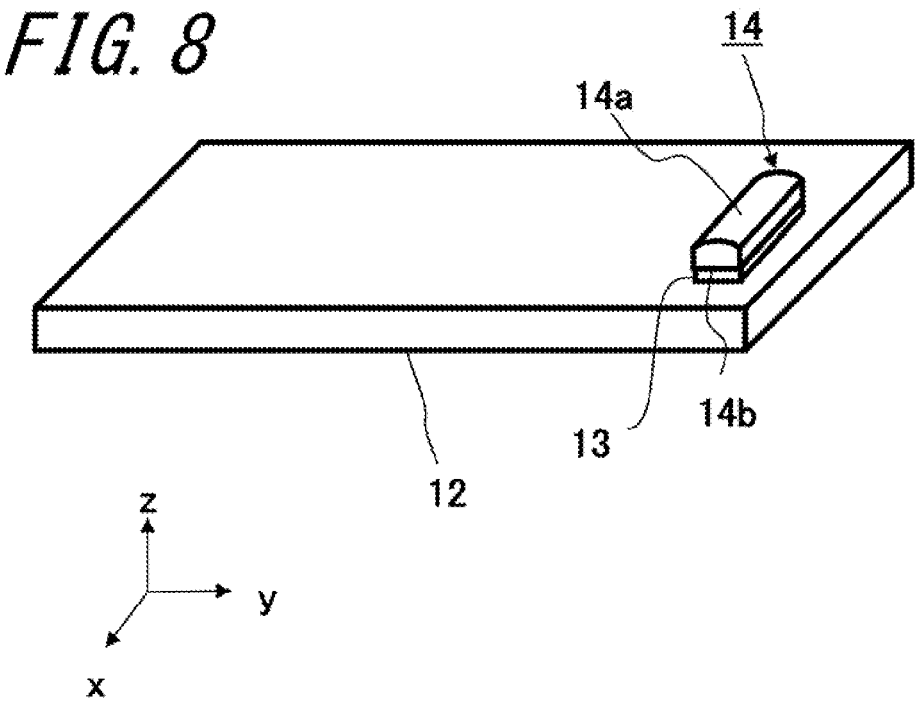
FIG. 8 is a perspective view schematically illustrating a piezoelectric vibration device according to a third example of the embodiment of the invention.

FIG. 8 is a perspective view schematically illustrating a piezoelectric vibration device according to the second example of the embodiment of the invention. In FIG. 8, for ease of drawing, a detailed structure of the piezoelectric vibration element 14 is not shown. Further, in the piezoelectric vibration device of the present example, different points from the piezoelectric vibration element according to the above-described first example of the embodiment will be described. Further, the same reference numerals are given to the same components, and description thereof will not be repeated. The piezoelectric vibration device of the example includes the piezoelectric vibration element 14 according to the above-described first example of the embodiment, a vibration plate 12, and a first bonding member 13, as shown in FIG. 8.

The vibration plate 12 has a rectangular and thin plate shape. The vibration plate 12 may be formed preferably using a material with high stiffness and elasticity such as an acrylic resin or glass. Further, the thickness of the vibration plate 12 is set to about 0.4 mm to 1.5 mm, for example.

The vibration plate 12 is mounted to the second surface 14b of the piezoelectric vibration element 14 through the first bonding member 13. Specifically, the piezoelectric vibration element 14 is fixed to the surface of the vibration plate 12 so that the third direction (y axis direction in the figure) of the piezoelectric vibration element 14 matches with the length direction of the vibration plate 12 at a central portion in the width direction (x axis direction in the figure) in one end portion (+y directional end portion in the figure) of the vibration plate 12 in the length direction. Further, the second surface 14b is entirely bonded to the vibration plate 12 through the first bonding member 13. The entirely bonded state includes a state where the entire surface of the second surface 14b is bonded and a state where an approximately entire surface of the second surface 14b is bonded.

The first bonding member 13 has a film shape. Further, the first bonding member 13 is formed of a material that is softer than the vibration plate 12 and is easily deformed, and is lower than the vibration plate 12 in an elastic modulus or rigidity such as a Young's modulus, rigidity modulus or volume modulus. That is, the first bonding member 13 is deformable, and is greatly deformed as compared with the vibration plate 12 when the same force is applied thereto. Further, in the first bonding member 13, when one main surface (main surface on the −z directional side in the figure) thereof is entirely fixed to a part of one main surface (main surface on the +z directional side in the figure) of the vibration plate 12, one main surface (main surface on the −z directional side in the figure) of the piezoelectric vibration element 14 is entirely fixed to the other main surface (main surface on the +z directional side in the figure) thereof.

The first bonding material 13 may be formed by a single member, or may be formed by a compound including several members. As the above-mentioned first bonding member 13, for example, a double sided tape in which an adhesive is attached to both sides of a base made of a non-woven fabric or the like, various elastic adhesives that are adhesives having elasticity, or the like may be preferably used. Further, it is preferable that the thickness of the bonding member be larger than the amplitude of bending vibration of the piezoelectric vibration element 14, but if the thickness is excessively thick, vibration is attenuated, and thus, for example, the thickness is set to about 0.1 mm to 0.6 mm.

The piezoelectric vibration device of the present example with such a configuration bends and vibrates the piezoelectric vibration element 14 by application of an electric signal, and thus, functions as a piezoelectric vibration device that vibrates the vibration plate 12. For example, the other end portion (−y directional end portion in the figure) of the vibration plate 12 in the length direction, peripheral portions of the vibration plate 12, or the like may be supported by a support member (not shown).

Since the piezoelectric vibration device of the present example is configured by the piezoelectric vibration element 14 in which occurrence of unnecessary vibration is reduced, it is possible to obtain a piezoelectric vibration device in which occurrence of unnecessary vibration is reduced.

In the piezoelectric vibration device of the present example, the vibration plate 12 is bonded to the flat second surface 14b of the piezoelectric vibration element 14. Thus, it is possible to achieve a piezoelectric vibration device in which the piezoelectric vibration element 14 and the vibration plate 12 are rigidly bonded to each other.

Further, in the piezoelectric vibration device of the present example, at least two electrodes (surface electrodes 31, 32 and 33) are arranged on the second surface 14b that is the surface mounted to the vibration plate 12 of the piezoelectric vibration element 14. Thus, it is possible to increase the bonding strength of the piezoelectric vibration element 14 and the vibration plate 12.

Further, in the piezoelectric vibration device of the present example, since the first surface 14a that is the surface opposite to the surface mounted to the vibration plate 12 has such a shape that the central portion thereof in the third direction (y axis direction in the figure) protrudes in the first direction (+z direction in the figure) as compared with the opposite end portions thereof in the third direction, it is possible to improve vibration symmetry in the first direction (z axis direction in the figure).

In the piezoelectric vibration device of the present example, the second surface 14b of the piezoelectric vibration element 14 is bonded to the vibration plate 12, but the first surface 14a of the piezoelectric vibration element 14 may be bonded to the vibration plate 12 as necessary.

Further, in the piezoelectric vibration device of the present example, the piezoelectric vibration element 14 is bonded to the vibration plate 12 so that the third direction (y axis direction in the figure) of the piezoelectric vibration element 14 matches with the length direction (y axis direction in the figure) of the vibration plate 12. Thus, it is possible to slightly reduce occurrence of unnecessary vibration of the vibration plate 12 due to unnecessary vibration of the piezoelectric vibration element 14 with an amplitude that varies in the third direction (y axis direction in the figure). Although a mechanism that causes this effect has not been clarified yet, it is considered that the size of attenuation of a wave that reaches the end portion of the vibration plate 12 may be associated with this effect.

Fourth Example of Embodiment

Figure 9:
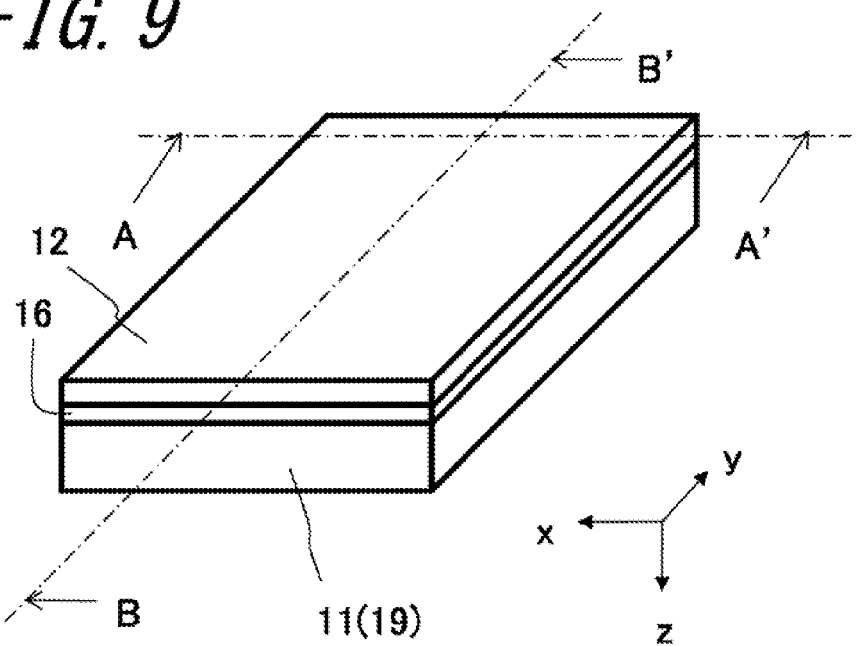
FIG. 9 is a perspective view schematically illustrating a portable terminal according to a fourth example of embodiment of the invention.
Figure 10:
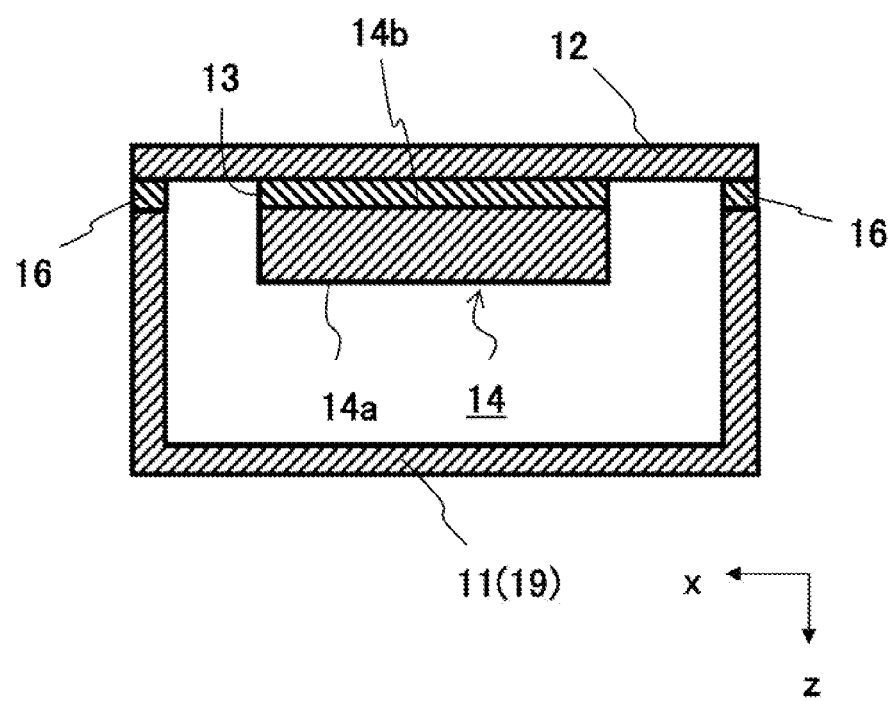
FIG. 10 is a cross-sectional view taken along the line A-A' in FIG. 9.
Figure 11:
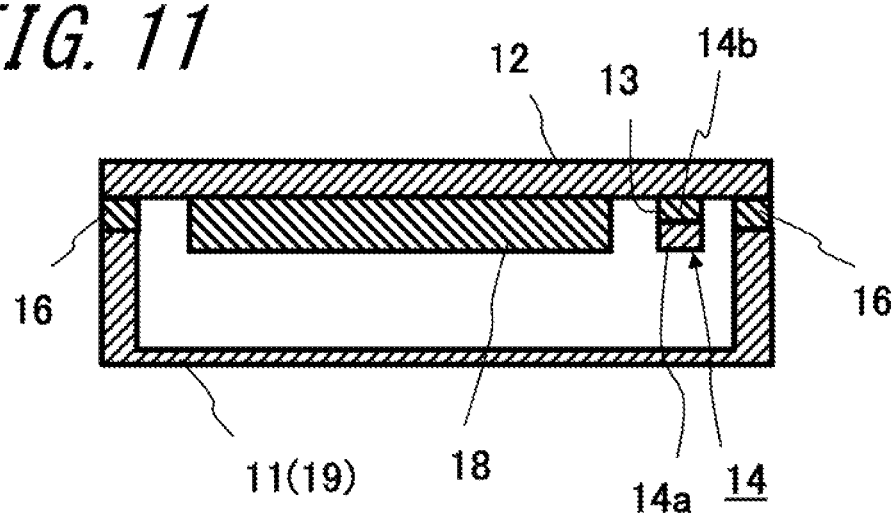
FIG. 11 is a cross-sectional view taken along the line B-B' in FIG. 9.

FIG. 9 is a perspective view schematically illustrating a portable terminal according to a fourth example of embodiment of the invention. FIG. 10 is a cross-sectional view taken along the line A-A' in FIG. 9. FIG. 11 is a cross-sectional view taken along the line B-B' in FIG. 9. In the present example, different points from the above-described third example of the embodiment will be described. Further, the same reference numerals are given to the same components, and repetitive description thereof will be omitted.

A portable terminal of the present example includes the piezoelectric vibration element 14, the vibration plate 12, the first bonding member 13, a second bonding member 16, a casing 19, a display 18, and an electronic circuit (not shown), as shown in FIGS. 9 to 11. Here, the vibration plate 12 functions as a cover of the display 18.

The casing 19 has a box shape whose one surface is opened. The casing 19 may be formed preferably using a material such as a synthetic resin having high rigidity and elasticity. Further, the casing 19 functions as a support body that supports the vibration plate 12 to be able to vibrate, and functions as a casing of the portable terminal. In the vibration plate 12, only the periphery of one main surface (main surface in the +z direction in the figure) is fixed to the casing 19 through the second bonding member 16, and is mounted to the casing 19 to be able to vibrate.

The second bonding member 16 has a film shape. Further, the second bonding member 16 is formed of a material that is softer than the vibration plate 12 and is easily deformed, and is lower than the vibration plate 12 in an elastic modulus or rigidity such as a Young's modulus, rigidity modulus or volume modulus. That is, the second bonding member 16 is deformable, and is greatly deformed as compared with the vibration plate 12 when the same force is applied thereto. Further, one main surface of the second bonding member 16 is entirely fixed to the peripheral portion of one main surface of the vibration plate 12, and the other main surface thereof is entirely fixed to the casing 19.

The second bonding material 16 may be formed by a single member, or may be formed by a compound including several members. As the above-mentioned second bonding member 16, for example, a double sided tape in which an adhesive is attached to both sides of a base made of a non-woven fabric or the like, may be preferably used. Further, the thickness of the second bonding member 16 is set so as to avoid attenuation of vibration due to an excessive thickness, and for example, is set to about 0.1 mm to 0.6 mm. That is, the second bonding member 16 is formed to be able to transmit vibration of the vibration plate 12 to the casing 19.

As the electronic circuit (not shown), for example, a circuit that processes image information to be displayed on the display 18 or sound information to be transmitted by the portable terminal, a communication circuit, or the like may be used. At least one of these circuits may be included, or all of these circuits may be included. Further, a circuit having a different function may be used. In addition, a plurality of electronic circuits may be included. The electronic circuit 17 and the piezoelectric vibration element 14 are connected to each other through a connection wiring (not shown).

The display 18 is a display apparatus that includes a function of displaying image information, and for example, known displays such as a liquid crystal display, a plasma display or an organic EL display may be preferably used. The display 18 may include an input device such as a touch panel. Further, a cover of the display 18 may be provided with an input device such as a touch panel.

The portable terminal of the present example is able to transmit sound information by transmitting vibration to a cartilage of the ear with the vibration plate 12 or the casing 19 being in contact with the ear in a direct way or through a different thing. That is, it is possible to transmit sound information by transmitting vibration to a cartilage of the ear with the vibration plate 12 or the casing 19 being in contact with the ear in a direct or indirect way. Thus, it is possible to obtain a portable terminal capable of transmitting sound information even in a noisy environment, for example. The thing interposed between the vibration plate 12 or the casing 19 and the ear may be a cover of the portable terminal, or may be a headphone or an earphone, for example. As long as the thing is capable of transmitting vibration, anything may be used.

Further, since the portable terminal of the present example transmits sound information using the piezoelectric vibration element 14 in which occurrence of unnecessary vibration is reduced, it is possible to transmit sound information with high quality.

Modified Examples

The present invention is not limited to the above-described examples of the embodiment, and various changes and modifications may be made in a range without departing from the scope of the invention.

For example, in the above-described second example of the embodiment, an example in which the flexible printed wiring board is used as the connection wiring 51 has been described, but the invention is not limited thereto. The connection wiring 51 may be a wiring capable of electrically connecting the piezoelectric vibration element 14 to the external circuit, and thus, known various wirings may be used.

Further, in the above-described examples of the embodiment, an example in which the first bonding member 13 and the second bonding member 16 are formed of a material that is softer than the vibration plate 12 and is easily deformed has been described, but the invention is not limited thereto. For example, the first bonding member 13 and the second bonding member 16 may be formed of a material that is rigid and is hard to be deformed with respect to the vibration plate 12. Further, a configuration in which the first bonding member 13 and the second bonding member 16 are not included may be used as necessary.

Further, in the above-described fourth example of the embodiment, an example in which the cover of the display 18 is the vibration plate 12 has been described, but the invention is not limited thereto. For example, the entire of the display 18 or a part of the display 18 may be used to function as the vibration plate 12.

Further, in the above-described fourth example of the embodiment, an example in which the casing 19 of the portable terminal functions as a support body that supports the vibration plate 12 has been described, but the invention is not limited thereto. For example, a part of the casing 19 may function as the support body, or a configuration in which the support body that supports the vibration plate 12 is mounted to the casing 19 may be used.

Further, in the above-described fourth example of the embodiment, an example in which vibration is transmitted to a cartilage of the ear with the vibration plate 12 or the casing 19 being in contact with the ear in a direct way or through a different thing to transmit sound information has been described, but the invention is not limited thereto. For example, a portable terminal that transmits sound information by propagating sound generated from the vibration plate 12 or the casing 19 in the air may be used. Further, a portable terminal that transmits sound information through a plurality of routes may be used.

Example

Next, a specific example of the piezoelectric vibration element of the invention will be described. A piezoelectric vibration device using the piezoelectric vibration element 14 according to the first example of the embodiment of the invention shown in FIGS. 1 to 4 was manufactured, and its characteristic was measured.

The piezoelectric vibration element 14 was set to have a rectangular parallelepiped shape of 23.5 mm in length, 3.3 mm in width, and 0.5 mm in thickness. Further, the piezoelectric vibration element 14 had such a structure that the piezoelectric layers 24 and the internal electrodes 21, 22 and 23 having a thickness of about 30 μm were alternately stacked, and the total number of the piezoelectric layers 24 was set to 16. The piezoelectric layer 24 was formed of lead zirconate titanate (PZT) in which a part of Zr is substituted by Sb. On the first surface 14a of the piezoelectric vibration element 14, the amount of protrusion in the +z direction in the figure of the central portion thereof in the third direction (y axis direction in the figure) with respect to the opposite end portions thereof in the third direction was 10% (0.05 mm) of the thickness of the piezoelectric vibration element 14. The second surface 14b of the piezoelectric vibration element 14 was almost flat.

Figure 12:
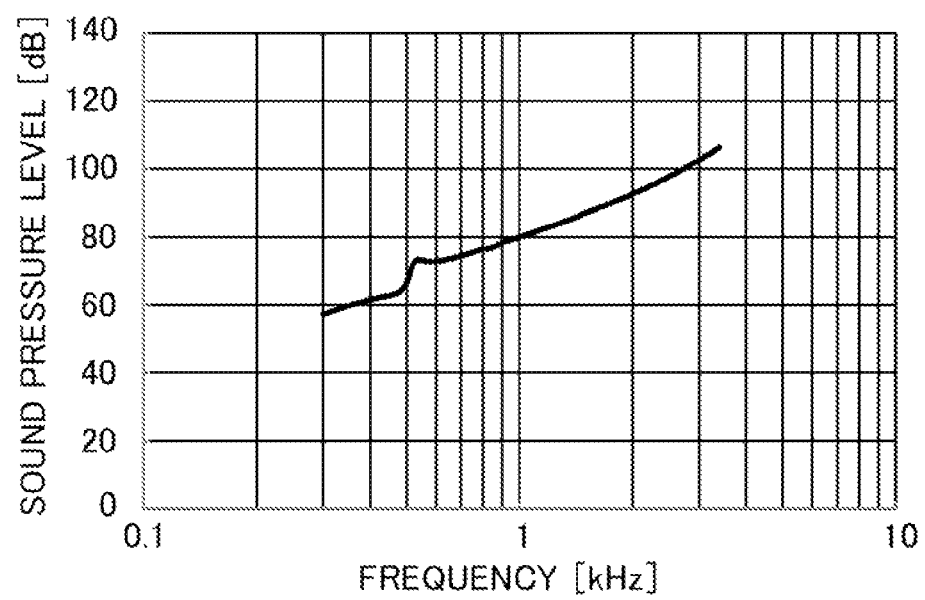
FIG. 12 is a graph illustrating a measurement result of a characteristic of the piezoelectric vibration device using the piezoelectric vibration element according to the first example of the embodiment of the invention.

Further, a glass plate was attached to a frame made of metal by a both sided tape, the second surface 14b of the piezoelectric vibration element 14 was attached by a both sided tape at the center of one surface of the glass plate, and a microphone was provided at a position spaced from the other surface of the glass plate by 1 mm. Further, a sine wave signal having an effective value of 3.0 V in which a frequency is changed in the range of 0.3 to 3.4 KHz was inputted to the piezoelectric vibration element 14, and sound pressure detected by the microphone was measured. The result is shown in FIG. 12. In the graph of FIG. 12, the horizontal axis represents frequency, and the vertical axis represents sound pressure. According to the graph shown in FIG. 12, it is confirmed that a flat and excellent characteristic in which peak or dip due to unnecessary vibration is small is obtained. Thus, effectiveness of the present invention was confirmed.

REFERENCE SIGNS LIST

12: Vibration plate
14: Piezoelectric vibration element
14a: First surface
14b: Second surface
17: Electronic circuit
18: Display
19: Casing
51: Connection wiring

The invention claimed is:

1. A portable terminal comprising:
 a piezoelectric vibration device, including
  a piezoelectric vibration element, including
   a plurality of electrode layers; and
   a plurality of piezoelectric layers, the plurality of electrode layers and the plurality of piezoelectric layers being stacked along a first direction,
  the piezoelectric vibration element having a first surface and a second surface both of which face each other so as to be at intervals in the first direction,
  the piezoelectric vibration element vibrating in bending mode in the first direction with an amplitude that varies along a second direction perpendicular to the first direction according to input of an electric signal,
  the first surface having such a shape that a central portion thereof in a third direction perpendicular to the first direction and the second direction protrudes as compared with opposite end portions thereof in the third direction; and
  a vibration member having one main surface to which either the first surface or the second surface of the piezoelectric vibration element is mounted, the vibration member being vibrated by the piezoelectric vibration element to generate sound information;
 a display disposed on the one main surface of the vibration member, the vibration member serving as a cover of the display; and
 a casing to which a periphery of the one main surface of the vibration member is fixed.

2. The portable terminal according to claim 1,
 wherein the first surface is configured so that a central portion of a region in which the plurality of electrode layers are present in the third direction protrudes as compared with opposite end portions thereof in the third direction.

3. The portable terminal according to claim 1,
wherein a connection wiring is mounted to the first surface.

4. The portable terminal according to claim 1,
wherein the first surface has such a shape that a central portion thereof in the second direction protrudes as compared with opposite end portions thereof in the second direction.

5. The portable terminal according to claim 1,
wherein the vibration member is mounted to the second surface.

6. The portable terminal according to claim 1,
wherein the third direction matches with a length direction of the vibration member.

7. The portable terminal according to claim 1,
wherein at least two electrodes are arranged on the surface to which the vibration member is mounted.

8. The portable terminal according to claim 1,
wherein the vibration member or the casing is in contact with an ear to transmit sound information.

9. A portable terminal comprising:
a piezoelectric vibration device, including:
  a piezoelectric vibration element, including:
    a plurality of electrode layers;
    a plurality of piezoelectric layers, the plurality of electrode layers and the plurality of piezoelectric layers being stacked along a first direction;
    the piezoelectric vibration element having a first surface and a second surface both of which face each other so as to be at intervals in the first direction;
    the piezoelectric vibration element vibrating in bending mode in the first direction with an amplitude that varies along a second direction perpendicular to the first direction according to input of an electric signal;
    the first surface having such a shape that a central portion thereof in a third direction perpendicular to the first direction and the second direction protrudes as compared with opposite end portions thereof in the third direction; and
  a vibration member having one main surface to which either the first surface or the second surface of the piezoelectric vibration element is mounted, the vibration member being vibrated by the piezoelectric vibration element to generate sound information;
a casing to which a periphery of the one main surface of the vibration member is fixed; and
a display located between the vibration member and the casing, the display facing the vibration member, the vibration member serving as a cover of the display.

10. A portable terminal comprising:
a piezoelectric vibration device, including:
  a piezoelectric vibration element, including:
    a plurality of electrode layers; and
    a plurality of piezoelectric layers, the plurality of electrode layers and the plurality of piezoelectric layers being stacked along a first direction;
    the piezoelectric vibration element having a first surface and a second surface both of which face each other so as to be at intervals in the first direction;
    the piezoelectric vibration element vibrating in bending mode in the first direction with an amplitude that varies along a second direction perpendicular to the first direction according to input of an electric signal;
    the first surface having such a shape that a central portion thereof in a third direction perpendicular to the first direction and the second direction protrudes as compared with opposite end portions thereof in the third direction; and
  a vibration member having one main surface to which either the first surface or the second surface of the piezoelectric vibration element is mounted, the vibration member being vibrated by the piezoelectric vibration element to generate sound information, the vibration member serving as a display of the portable terminal; and
a casing to which a periphery of the one main surface of the vibration member is fixed.

11. A portable terminal comprising:
a piezoelectric vibration device, including:
  a piezoelectric vibration element, including:
    a plurality of electrode layers;
    a plurality of piezoelectric layers, the plurality of electrode layers and the plurality of piezoelectric layers being stacked along a first direction;
    the piezoelectric vibration element having a first surface and a second surface both of which face each other so as to be at intervals in the first direction;
    the piezoelectric vibration element vibrating in bending mode in the first direction with an amplitude that varies along a second direction perpendicular to the first direction according to input of an electric signal;
    the first surface having such a shape that a central portion thereof in a third direction perpendicular to the first direction and the second direction protrudes as compared with opposite end portions thereof in the third direction; and
  a vibration member having one main surface to which either the first surface or the second surface of the piezoelectric vibration element is mounted, the vibration member being vibrated by the piezoelectric vibration element to generate sound information, the vibration member serving as a part of a display of the portable terminal; and
a casing to which a periphery of the one main surface of the vibration member is fixed.

* * * * *